United States Patent [19]

Toth et al.

[11] Patent Number: 5,479,384
[45] Date of Patent: Dec. 26, 1995

[54] OPTICAL STORAGE DEVICE HAVING A PLURALITY OF JUXTAPOSED MEMORY CELLS

[75] Inventors: Peter Toth, Televägen 6, S-374 52 Asarum, Sweden; Karoly Jozsef, Pecs, Hungary

[73] Assignee: Peter Toth, Asarum, Sweden

[21] Appl. No.: 284,595

[22] PCT Filed: Feb. 17, 1993

[86] PCT No.: PCT/SE93/01126

§ 371 Date: Aug. 12, 1994

§ 102(e) Date: Aug. 12, 1994

[87] PCT Pub. No.: WO93/16476

PCT Pub. Date: Aug. 19, 1993

[30] Foreign Application Priority Data

Feb. 18, 1992 [SE] Sweden ................................. 9200480

[51] Int. Cl.⁶ ........................... G11B 13/04; G11C 11/42
[52] U.S. Cl. ............................ 364/14; 365/109; 365/117; 365/145
[58] Field of Search ................................. 369/14, 15, 273, 369/274, 275.3, 280, 281, 284, 288, 289; 365/117, 109, 145, 112, 118, 121, 122, 128, 134, 140

[56] References Cited

U.S. PATENT DOCUMENTS

| | | | |
|---|---|---|---|
| 3,703,137 | 11/1972 | Anderson et al. | 359/25 |
| 3,868,652 | 2/1975 | Cooper et al. | 365/117 |
| 4,101,975 | 7/1978 | Brody | 365/117 |
| 4,247,914 | 1/1981 | Brody | 365/109 |
| 4,250,567 | 2/1981 | Brody | 365/109 |
| 5,051,950 | 9/1991 | Evans, Jr. et al. | 365/117 |
| 5,060,191 | 10/1991 | Nagasaki et al. | 365/117 |
| 5,065,378 | 11/1991 | Oda et al. | 369/14 |
| 5,179,533 | 1/1993 | Bullington et al. | 365/117 |
| 5,327,373 | 7/1994 | Liu et al. | 365/109 |

FOREIGN PATENT DOCUMENTS

| | | |
|---|---|---|
| 0164577 | 12/1985 | European Pat. Off. . |
| 2659780 | 9/1991 | France . |

OTHER PUBLICATIONS

"Optical High Density direct Access Storage Device", *IBM Technical Disclosure Bulletin* vol. 31 No. 5 Oct.1 1988 2 Pages.

Patent Abstract of Japan, vol. 10, No. 324, (P512) Abstract of Japanese patent publication No. A, 61–131247, Jun. 8, 1986.

*Primary Examiner*—Georgia Y. Epps
*Assistant Examiner*—Tan Dinh
*Attorney, Agent, or Firm*—Beveridge, DeGrandi, Weilacher & Young

[57] ABSTRACT

The invention relates to a read-write optical memory comprising a plurality of juxtaposed memory cells (11), each receiving a respective light beam (3). Each memory cell contains a storage medium (10), which includes a storage element (23) having stable optical states. The storage element (23) is divided into a number of memory points, and the optical state in a given memory point can be both changed and read by means of a light beam (3) directed towards the memory point. The memory can be implemented entirely without any movable mechanical parts and has a very short read-write time and an exceptionally high storage capacity. Parallel writing and reading of multibit words is possible.

18 Claims, 9 Drawing Sheets

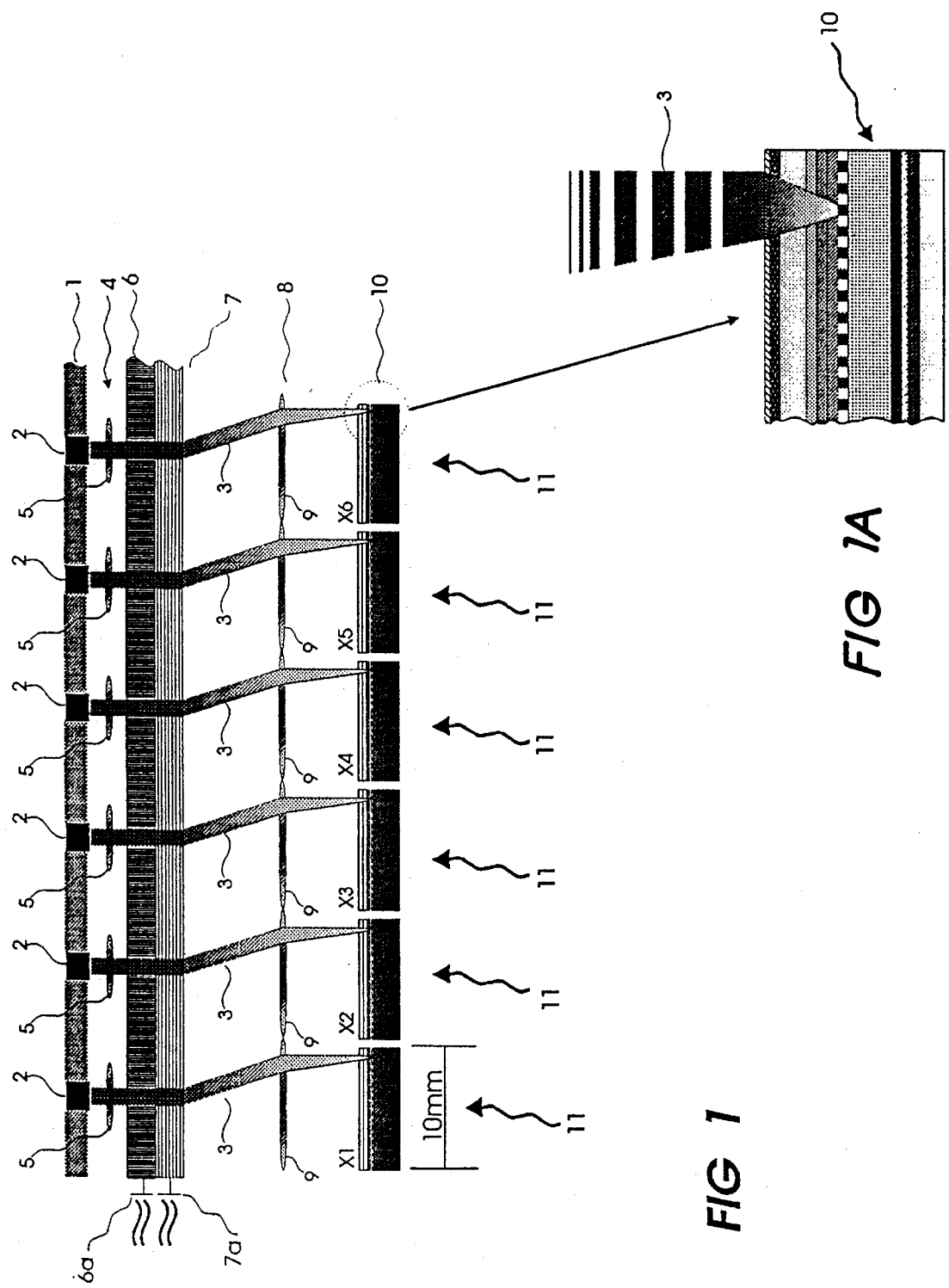

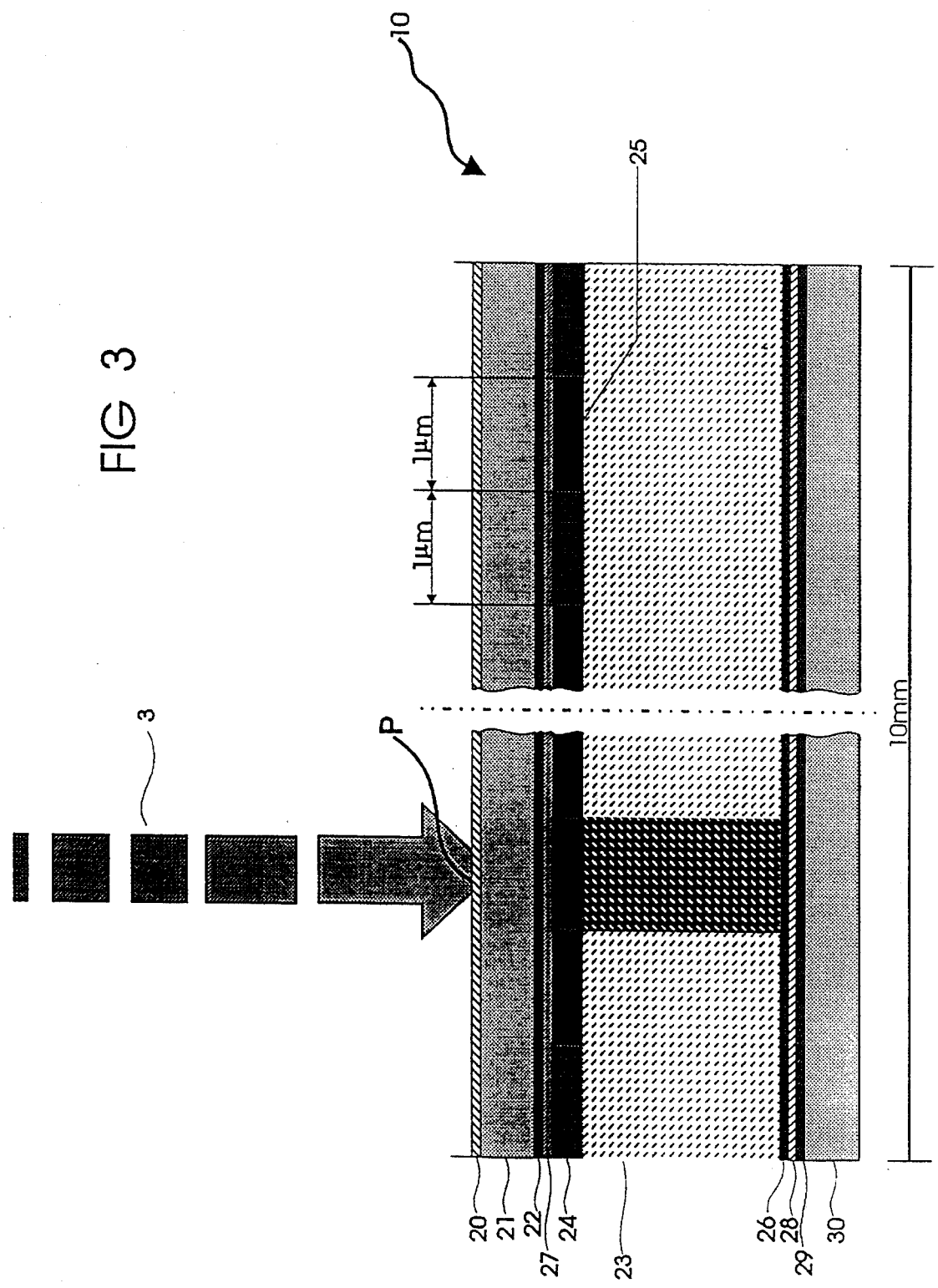

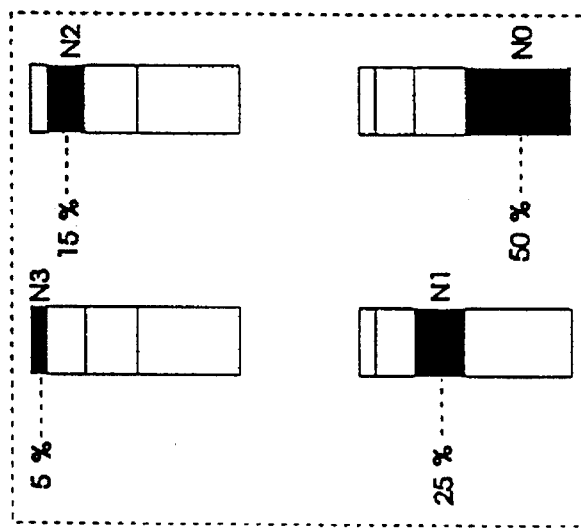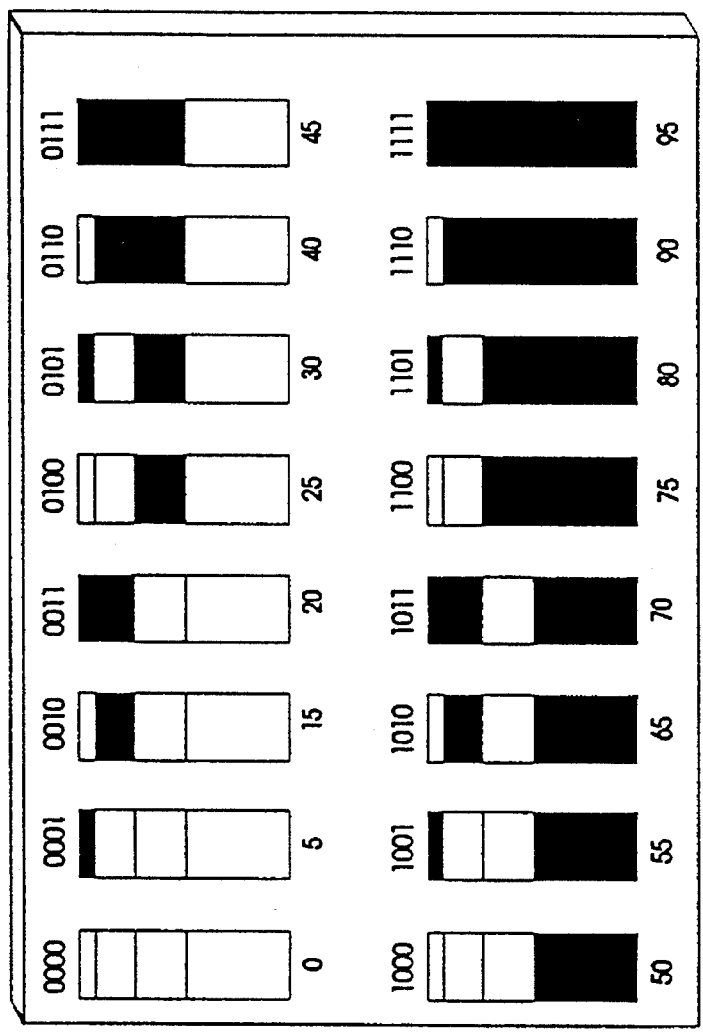
*FIG 7*
(FIG 6)

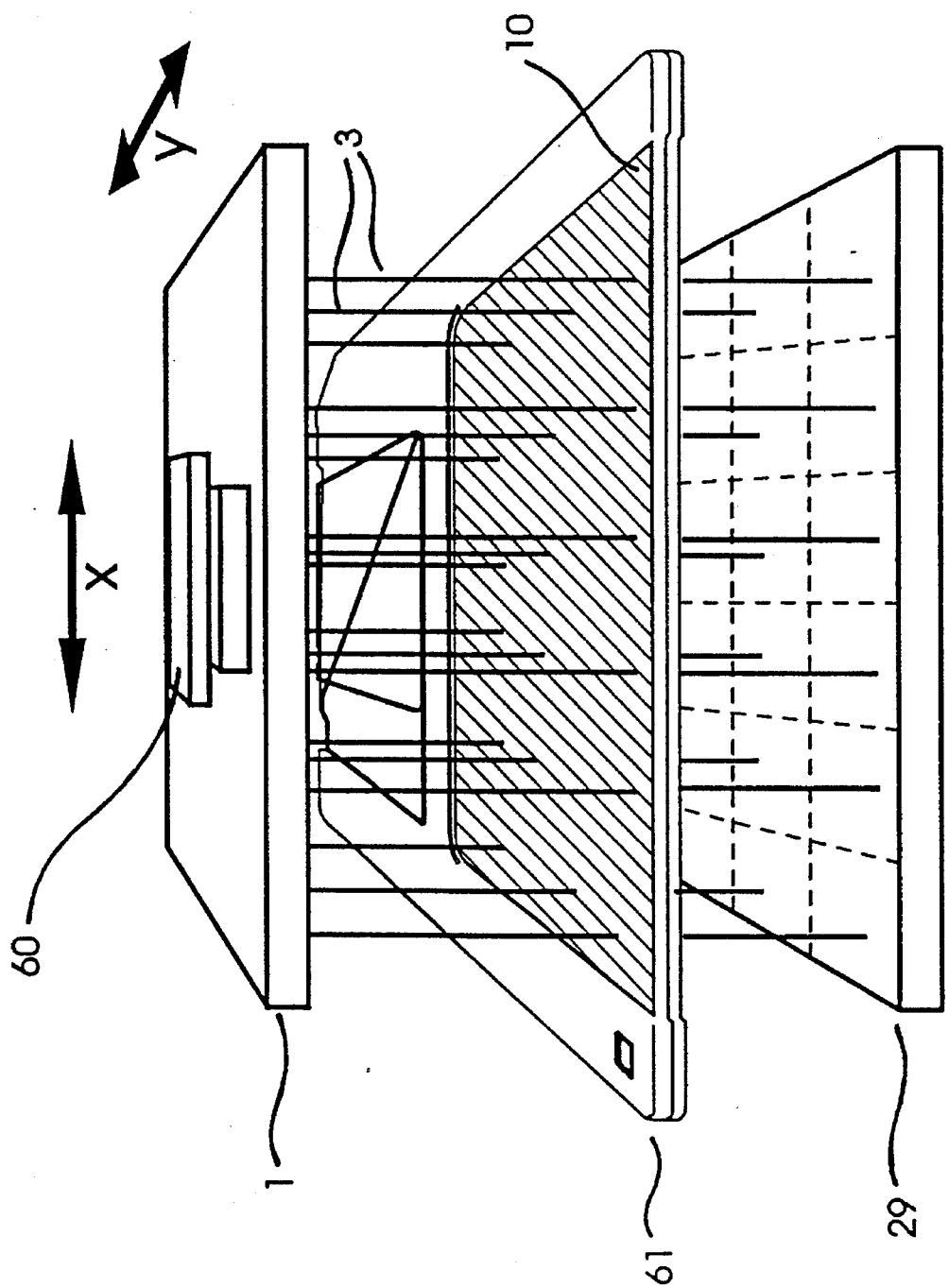

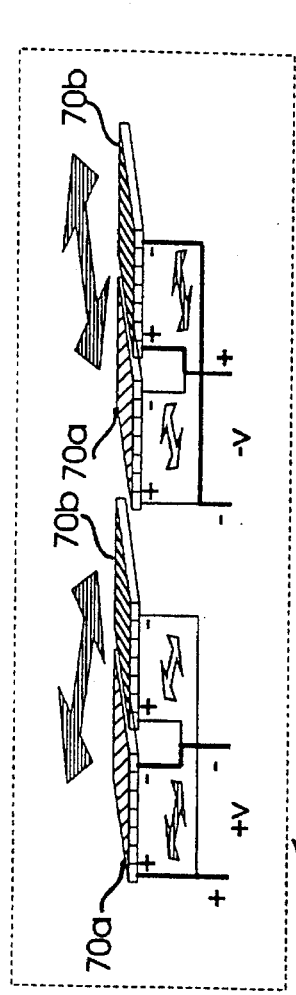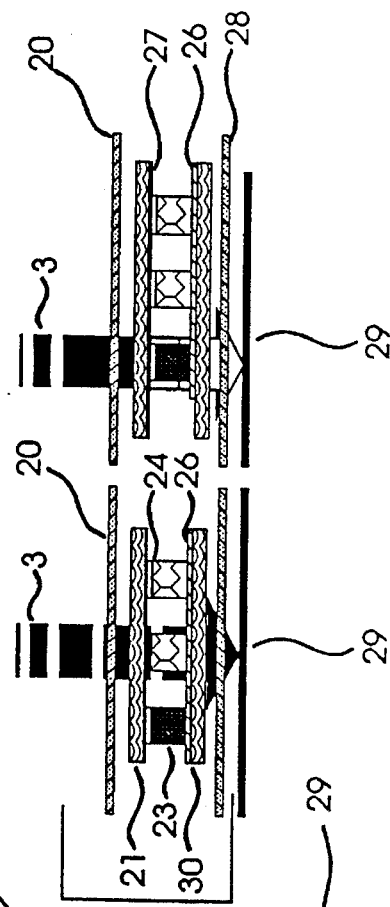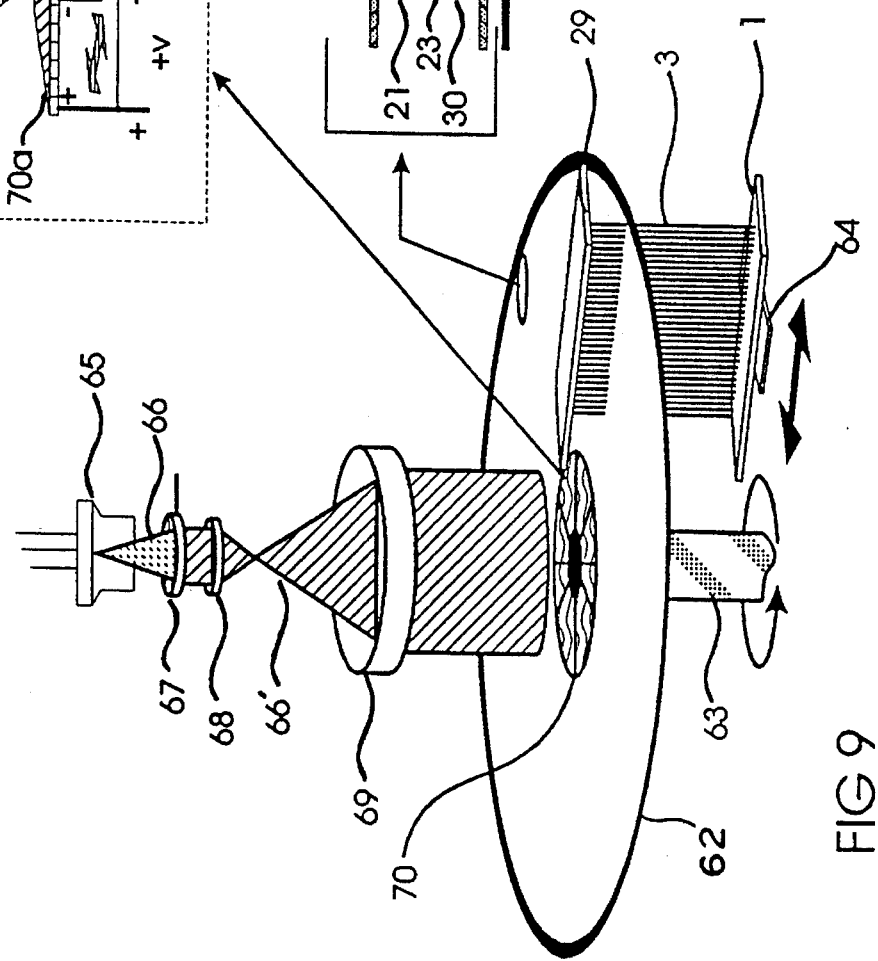
FIG 9b
FIG 9a
FIG 9

OPTICAL STORAGE DEVICE HAVING A PLURALITY OF JUXTAPOSED MEMORY CELLS

FIELD OF THE INVENTION

The present invention relates to an optical memory. More specifically, the invention relates to an optical memory which has a high storage capacity, short access time for writing and reading of information, and which can be implemented entirely without any movable mechanical parts.

DESCRIPTION OF THE PRIOR ART

Today's systems for mass storage of binary information can be roughly divided into three main categories:

1. Magnetic medium (hard disc)
2. Optical medium (CD-ROM)
3. Magneto-optical medium 1. A hard disc, i.e. a magnetic disc storage which is mechanically rotated when writing and reading information, requires mechanical positioning of a read-write head, entailing a relatively long average seek time for positioning in the order of 10–15 ms, a limited read-write speed, as well as a relatively limited storage capacity. In principle, the storage capacity of a hard disc can only be increased by using a larger area, which entails the disadvantage of necessitating a larger movement for positioning, i.e. a longer seek time.

2. A CD-ROM has a comparatively high storage capacity, but is a slow medium which does not permit writing but only reading since, traditionally, the information is stored when making the memory.

3. A magneto-optical medium, which is of a design closely related to that of a CD-ROM, acts such that the information is stored on a rotary disc containing magnetic particles which, when writing the information, are heated by a laser beam above their Curie temperature. Drawbacks of this type of storage medium are the relatively limited capacity and the slow writing speed. Writing may, for example, be up to six times slower than for a hard disc.

SUMMARY OF THE INVENTION

With the ever increasing need of information storage, there is a great demand for a storage medium that does not suffer from the aforementioned drawbacks of the prior art. A general object of the invention is to provide a storage medium meeting this demand.

A first object of the invention is to provide a storage medium having a high storage capacity.

A second object of the invention is to provide a storage medium having short access time for writing and reading of information.

A third object of the invention is to provide a storage medium that can be implemented without any mechanically movable parts.

A fourth object of the invention is to provide a storage medium having a compact structure and relatively small dimensions, and being relatively inexpensive to manufacture.

A fifth object of the invention is to provide a storage medium enabling parallel writing and reading of information.

To achieve these and other objects, there is provided according to the invention an optical memory, comprising: a plurality of juxtaposed memory cells, each of which is adapted to receive a respective light beam and each of which comprises a storage medium including:

(a) a storage element switchable between at least two stable states having mutually different optical properties by applying corresponding electric fields between a light entry side and an opposite light exit side of the storage element;

(b) an electrode matrix arranged on one of the light entry side and the light exit side of the storage element and exhibiting a plurality of mutually electrically insulated electrode points distributed over the storage element, corresponding to an equal plurality of memory points in the storage medium;

(c) a common electrode arranged on and extended over the other of the light entry side and the light exit side of the storage element; and (d) a photoconductive layer acting as a light-controlled switch and having light-dependent electric resistance, said layer being arranged over and in electrical contact with the electrode matrix on the side thereof facing away from the storage element, whereby an electric field is selectively applicable over a given memory point in the storage element by selectively illuminating the corresponding point on the photoconductive layer while applying an electric control voltage between the photoconductive layer and the common electrode, and electrically controlled means for bringing about a simultaneous and mutually equally large displacement of the point of incidence of each of the light beams of the memory cells on the corresponding memory cell.

In an optical memory according to the invention, each memory point of the storage medium of each individual memory cell can thus be efficiently and rapidly addressed with the aid of a light beam, preferably an accurately focused laser beam, directed towards the memory point.

It should be noted that no separate electric lead wires are required to the individual punctiform electrodes of the electrode matrix. This enables an extremely high packing density of the memory points of the optical memory. The electrode points of the matrix electrode may, by way of example only, have an extent of about 1 μm and a mutual spacing of about 1 μm. This gives 5000×5000= 25 million memory points per square centimeter of light receiving area in the storage medium.

Writing

Writing of desired information, such as a logic 1 or 0, into a specific memory point of the optical memory according to the invention is carried out in the following way.

A control voltage, which can bring the storage element to the stable optical state representing said desired information, is applied between the photoconductive layer and the common electrode. At the same time, the specific memory point is addressed by means of a light beam, which is directed towards the electrode point that coincides with the specific memory point. The photoconductive layer will then, in its illuminated point, exhibit a reduced electric resistance as compared with the unilluminated area of the layer. At the illuminated memory point, a major part of the control voltage applied will therefore be located between the "illuminated" electrode point of the electrode matrix and the common electrode, i.e. over the corresponding memory point of the storage element. The stable state of the illuminated memory point is thus determined by the control voltage applied.

Unilluminated areas of the photoconductive layer do not exhibit any such reduced electric resistance. At unilluminated memory points, a major part of the control voltage applied will be located over the photoconductive layer and a minor part thereof will be located between the "unilluminated" electrode points and the common electrode. The stable optical states of unilluminated memory points, i.e. information previously stored in unilluminated memory points, will thus not be affected by the light beam, despite the presence of the control voltage between the photoconductive layer common to all the memory points, and the electrode common to all the memory points.

For writing information into the optical memory according to the invention, it is thus possible, for each one of the memory cells, to address by means of a light beam a specific memory point among a very large number of memory points, and create by means of the photoconductive layer an electric field over the storage element, restricted precisely to that area of the storage element which in the direction of the light beam coincides with the illuminated memory point.

Thanks to the storage element having stable states, information that has been written into a memory point will remain unchanged also after the light beam and, hence, the electric field have been removed from the memory point.

Read-out

Read-out of stored information from a specific memory point can be performed in the following way.

As opposed to the writing operation as described above, no control voltage is applied in the read-out operation between the photoconductive layer and the common electrode. The specific memory point is however addressed in the same way as in the writing operation, with the aid of a light beam directed towards the electrode point coinciding with the memory point. Since no control voltage is applied, the decrease in resistance which occurs at the corresponding illuminated point of the photoconductive layer will not affect the information that has been stored in the addressed (illuminated) memory point. For read-out of the information that has been stored in the addressed memory point, i.e. for determining the stable optical state of the storage element in the illuminated memory point, use is made of the fact that the light beam will be affected differently depending on the stored optical state in the addressed memory point. By detecting this effect on the light beam, the optical state of the addressed memory point, i.e. the information stored therein, can be established.

Several Memory Cells / Parallel Writing and Reading

The optical memory according to the invention comprises a plurality of juxtaposed memory cells, each of which comprises a storage medium of the type described above for receiving a respective light beam. The "hierarchy" of the memory thus means that the memory has a plurality of memory cells, and the storage medium included in each memory cell has a respective array of memory points.

Each such memory cell receives a light beam of its own for writing and read-out. Thus, the point of incidence of the light beam on the corresponding memory cell need only be displaced between memory points included precisely in this memory cell. Consequently, there are as many light beams as memory cells.

Such a plurality of light beams may, for example, be generated with the aid of a laser diode field comprising a matrix of individual semiconductor lasers. It is however also conceivable to use a single light source combined with beam splitting.

The optical memory according to the invention further comprises electrically controlled means for bringing about a continuous and mutually equally large displacement of the point of incidence of each one of the light beams of the memory cells on the corresponding memory cell. This enables a highly efficient parallel writing into and parallel read-out from several memory cells at a time.

According to the invention, such a displacement of the points of incidence of the light beams can be brought about in some basically different ways.

According to a first alternative, the memory cells and the light sources (alternatively, a single light source with beam splitting) may be stationary in relation to each other. In one such embodiment of the invention, the electrically controlled means may comprise light-beam-deflecting acousto- or electro-optical crystal layers which are located on the light entry side of the memory cells and which are common to several or all of the memory cells of the optical memory. Especially, the memory cells may be arranged beside each other in rows and columns, in which case such light-beam-deflecting crystal layers may comprise a first and a second crystal layer for deflecting the light beams parallel to said rows and columns, respectively. In this embodiment, the light source, such as a laser diode field comprising a matrix of individual semiconductor lasers, may form an intergral part of the optical memory.

According to a second alternative, the displacement of the points of incidence of the light beams may be brought about by a displacement of the light source itself, while holding the memory cells stationary. In such an embodiment of the invention, the memory preferably includes a light-source matrix of individual light sources for generating a separate light beam for each memory cell, the electrically controlled means being connected to a light-source matrix to bring about a displacement thereof and, hence, a continuous and mutually equally large displacement of all the individual light sources. Preferably, the electrically controlled means may then comprise a piezoelectric motor device.

According to this second variant of the invention, the memory cells may be arranged as a replaceable memory disc or memory diskette which in use is disposed stationary in the light beam paths.

According to a third alternative, both the memory cells and the light sources may be movable. In such an embodiment of the invention, the memory cells may be provided in the form of concentric rings on a common disc or the like, whose opposite two main surfaces form the light entry side and the light exit side, respectively, of the memory cells, said disc being rotatable about a centre axis, and the memory points of each memory cell being distributed both radially and circumferentially with respect to said axis. This embodiment preferably includes a light-source matrix comprising a row of individual light sources, radially extended with respect to the axis of rotation of the disc, for generating a separate light beam for each memory cell, the electrically controlled means being connected to the light-source matrix to bring about a radial displacement of the light sources with respect to the axis of rotation of the disc.

By the rotation of the disc and the radial displacement of the light-source matrix, concurrently or separately, it is thus possible to bring about said displacement of the points of incidence of the light beams on the memory cells. In this embodiment, the electrically controlled means may comprise a radially acting piezoelectric motor device.

According to an embodiment of particular interest of the alternative using a rotary disc, the disc is provided with a photocell means which is adapted to receive light from a preferably stationary light source and generate, in response thereto, the control voltage between the photoconductive layer and the common electrode of the memory cells.

Different Optical States = Different Transmittance

According to a preferred embodiment of the invention, the different optical states of the storage element correspond to different states of light transmittance of the storage medium. In this embodiment, use may be made of two mutually crossed polarizers arranged on a respective side of the storage element in association with a storage element, the molecules of which can be affected by a superimposed electric field and rotate the light vector of an incident, polarized light beam to a different degree depending on the field applied. If a rotary disc is used, each of the polarizers may be either arranged on the disc or arranged stationary.

Light-Sensitive Layer for Read-out

For detecting the different states of light transmittance of the storage medium in connection with read-out, the storage medium of each memory cell may comprise a light-sensitive element of its own arranged on the light exit side of the storage element for receiving and detecting a light beam which is to be directed through the storage medium for read-out of stored information. These light sensitive elements of the memory cells should be insulated from each other to permit a simultaneous parallel read-out of information stored in the memory points of several memory cells.

Choice of Material

A storage element included in a storage medium of an optical memory according to the invention may, for example, comprise a ferroelectric liquid crystal (hereinafter termed FLC), especially in smectic C*-phase and advantageously of polymeric design, a PLZT ceramic or a PLZT thin film, or a material using electro-optic effect based on electrochromism. These materials are however merely given as examples. They differ in respect of such properties as speed, current consumption and required field strength for excitation.

A conceivable variant is using for the storage element a material which is switchable between three or more stable optical states, for example such that different optical states correspond to transmittance of different colors.

Several Storage Levels

To increase the storage capacity of an area of a given size, it is possible to increase the resolution of the memory points, i.e. to reduce the size of the points and/or their mutual spacing. It is however also possible to modify the optical memory such that more than one bit can be stored in each memory point.

To provide such a possibility of storing more than one bit in each memory point, the optical memory according to the invention may, in a preferred embodiment, comprise two or more, especially four or eight, storage levels arranged on each other and each having one storage medium of the aforementioned type, each memory point in this embodiment having a corresponding number of memory positions. Thus, it is possible, for example, especially to store four and eight bits, respectively, in each memory point. In addition to the increased storage capacity, the write time and the access time are reduced correspondingly. Such an embodiment having several storage levels however requires only two polarizers, one position-sensitive layer and one light-sensitive detecting layer of the aforementioned type. However, each storage level requires a photoconductive layer, an electrode matrix, a storage element and a common electrode.

These and other features of the invention are stated in the appended claims.

DESCRIPTION OF EMBODIMENTS

Embodiments of the invention will now be described in more detail with reference to the accompanying drawings.

FIG. 1 is a schematic cross-sectional view of an embodiment of an inventive optical memory of single-layer type.

FIG. 1A is an enlarged view of a portion of FIG. 1.

FIG. 3 is a schematic, partially broken-away cross-sectional view of a memory cell in the optical memory of FIG. 1.

Figure 4:
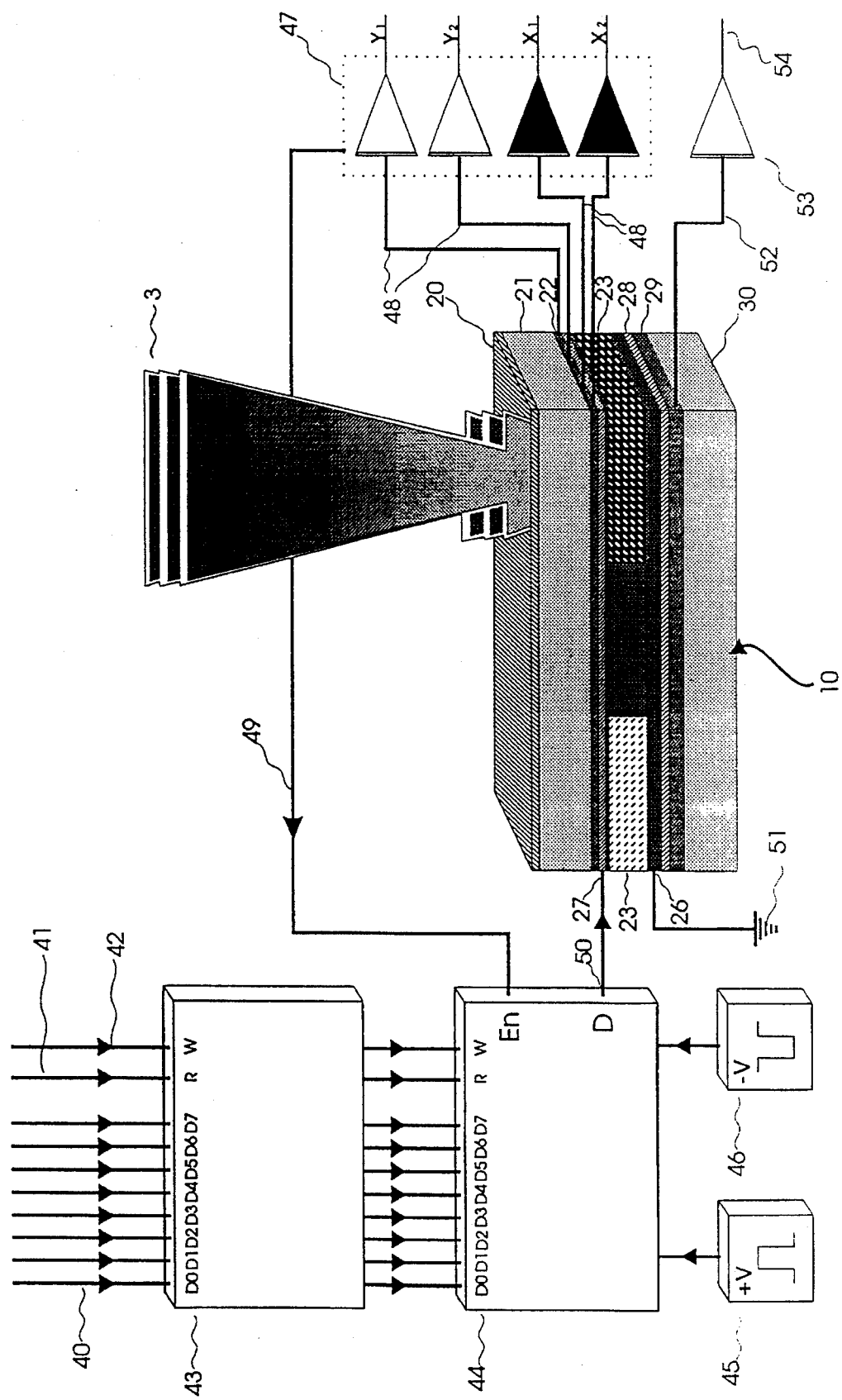

FIG. 4 schematically illustrates read-write operations on the optical memory of FIGS. 1–3 and especially illustrates peripheral electronics connected thereto.

Figure 5:
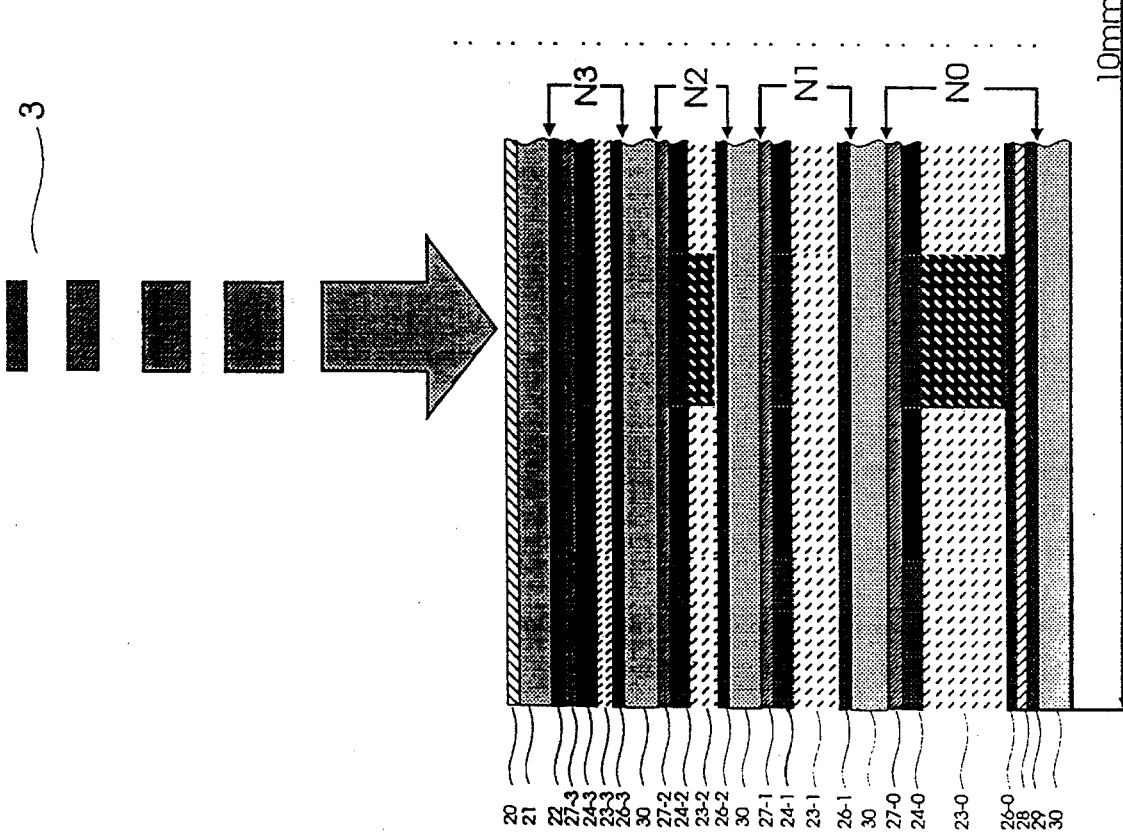

FIG. 5 is a cross-sectional view similar to FIG. 3, showing another embodiment of an inventive optical memory of multilayer type.

Figure 6:
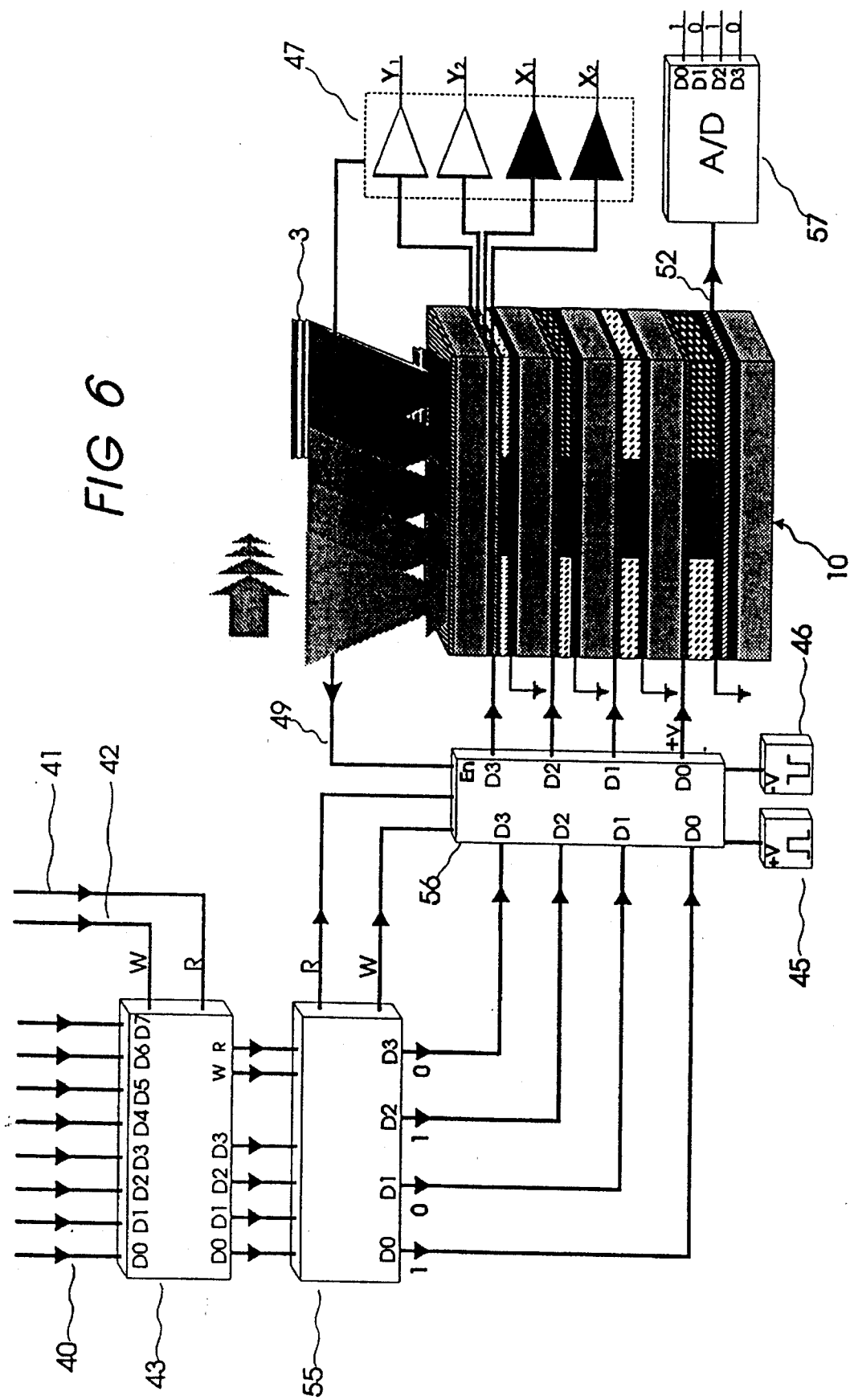

FIG. 6 schematically illustrates read and write operations on the optical memory of FIG. 5 and especially illustrates peripheral electronics connected thereto.

FIG. 7 illustrates the function of the embodiment in FIG. 5.

FIG. 8 is a schematic perspective view of a third embodiment of the invention.

FIG. 9 is a schematic perspective view of a fourth embodiment of the invention.

FIGS. 9A–9B show details of the embodiment in FIG. 9.

SINGLE LEVEL—DESIGN

A first embodiment of an optical memory according to the invention will now be described with reference to FIG. 1.

The optical memory in FIG. 1 has no mechanically movable parts and is at least partly (bottom of FIG. 1) designed as a laminated multilayer structure whose dimensions are substantially dependent on the desired storage capacity of the memory.

Laser Diode Field 1

Figure 2A:
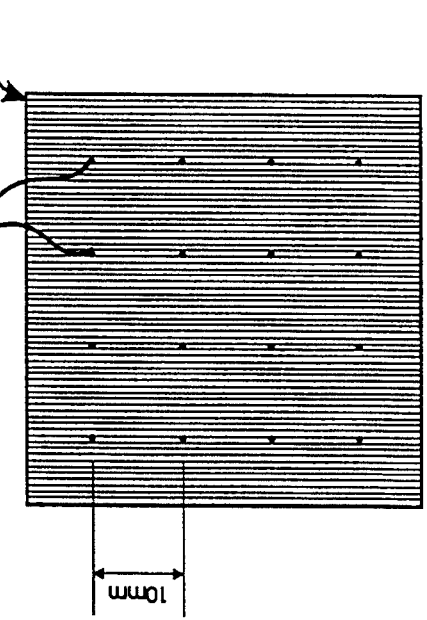
FIGS. 2A–2D are schematic plan views of part components included in an optical memory according to the invention.

At the top of the structure in FIG. 1, there is a laser diode field, generally designated 1, comprising a plurality of semiconductor laser diodes 2 for emitting a respective laser beam 3 downwards in the structure. Light-emitting diodes are a possible alternative. The laser diodes 2 are arranged equidistantly in an N×M grid. FIG. 2A which is a schematic plan view of such a laser diode field 1 on a full scale, shows a grid with 4×4= 16 laser diodes 2. In the embodiments of FIGS. 1 and 2A, the laser diodes 2 are spaced apart about 10 mm.

The optical memory of FIG. 1 has a memory cell for each laser diode 2. An optical memory with a laser diode field 1 according to FIG. 2A thus has a total of sixteen memory cells. The optical memory according to the invention may however have considerably more memory cells than the sixteen cells shown in FIG. 2A. Thus, the embodiment of FIG. 1 may be considered to illustrate a broken-away part of a memory structure having a larger number of memory cells with a respective laser diode 2. In FIG. 1, each separate memory cell is generally designated 11.

Collimating Lens System 4

Below the laser diode field 1, there is a collimating lens system 4, comprising a collimating lens 5 for each laser beam 3. The collimating lenses 5 are centred to the respective laser diode 2 and serve to collimate the laser beam matrix 3 emitted from the laser diode field 1.

Deflecting System 6, 7

Below the collimating lens system 4, there is an electro-optical (EO) or an acousto-optical (AO) deflecting system 6, 7 for deflecting the collimated laser beam matrix 3. The deflecting system of the optical memory in FIG. 1 is of acousto-optical type and comprises a first AO crystal 6 for deflecting the laser beams 3 in the y-direction (perpendicular to the drawing plane in FIG. 1) and a second AO crystal 7 for deflecting the laser beams 3 in the x-direction (right-left in FIG. 1).

The purpose of the deflecting system 6, 7 is to accurately position the points of incidence of the laser beams 3 in the x-direction and the y-direction. This is achieved by applying on the crystal layer 6 and 7, respectively, high-frequency voltage signals, typically of 50–80 Mhz. Deflection can be done in an accurately linear fashion depending on the frequency applied, and an arbitrary centre frequency may correspond to zero deflection.

As is known to a person skilled in the art, this linear relationship between control frequency and deflection can be made so exact that it is possible in an extremely accurate way to predict the x- and y-deflection of the laser beams 3 for given frequencies applied to the crystal layers 6 and 7.

In FIG. 1, the deflecting crystals 6 and 7 are extended over substantially the entire structure in the x- and y-directions and are thus common to all the memory cells 11. All the laser beams 3 are therefore deflected jointly and in unison, which can be compared to a field of corn where all the stems bend in one and the same direction when the wind changes its direction. This property is of great importance, since it permits parallel writing and reading of entire or parts of multibit words, as will be described in more detail below.

In other words, there is no individual addressing in FIG. 1 for deflecting the laser beams 3. The deflecting crystal layers 6 and 7 are readily controlled by connecting voltage electrodes on peripheral sides thereof, as schematically shown in FIG. 1 at 6a and 7a, respectively.

Such an AO deflecting system 6, 7 may in practice be produced from monocrystalline tellurium dioxide (TeO2) using anisotropic Bragg diffraction. The reaction speed of such a deflecting system may be some microseconds. This is however only one out of several possible examples of materials.

As an alternative, the optical memory may instead have a separate deflecting system for each laser beam 3, in which case the deflecting systems are controlled in parallel so as to obtain the same deflecting function as in FIG. 1.

Matrix of Scanning Optics 8

Figure 2B:
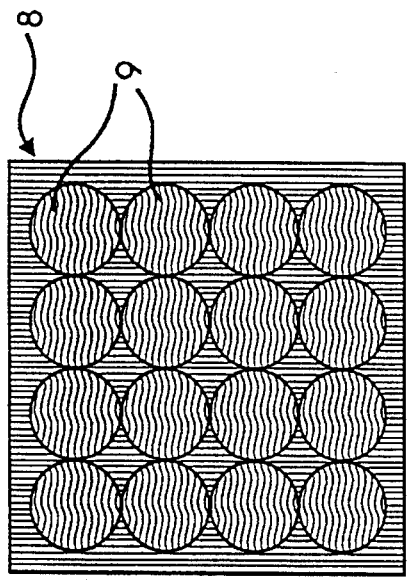
Figure 2C:
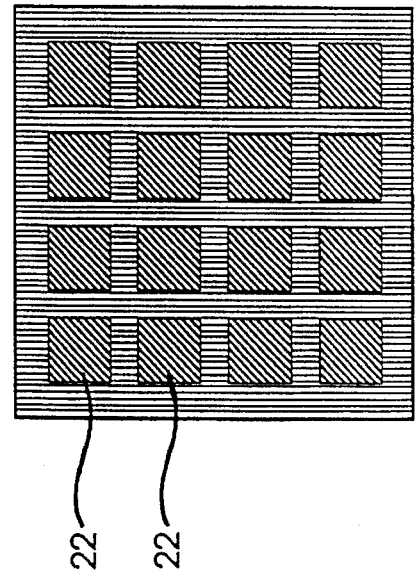
Figure 2D:
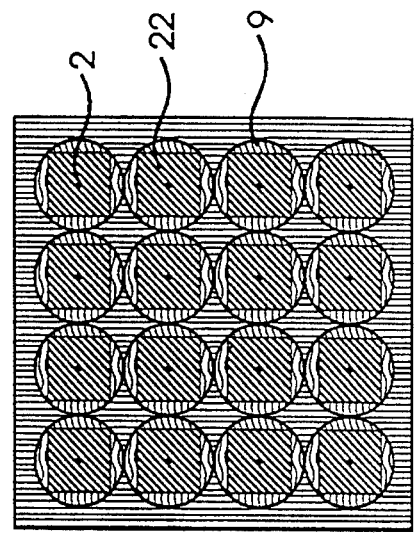

Below and at a distance from the deflecting system 6, 7, there is provided a matrix of scanning optics generally designated 8, comprising a plurality of scanning lenses 9, one for each laser beam 3. The scanning lenses may, for example, be of the F-theta-lens type. FIG. 2B, which is a schematic full-scale plan view of such a matrix of scanning optics 8, shows a matrix having sixteen scanning lenses 9 pertaining to the sixteen laser diodes 2 in FIG. 2A.

Storage Medium 10 (=20–29)

Below the matrix of scanning optics 8 is the actual storage medium 10 of the memory, on which the laser beams 3 are focused, as shown in FIG. 1, is shown especially in the enlarged detail representation of FIG. 1A (bottom of same drawing sheet) of part of a memory cell 11.

The storage medium 10 is a laminated structure for each memory cell 11, whose height in the embodiment of FIG. 1 may, in a non-restricting example, be in the order of a few centimeters.

FIG. 3, to which reference is now made, is an enlarged cross-sectional view showing a single memory cell 11 of the storage medium 10 in FIG. 1, e.g. the memory cell X6 furthest to the right in FIG. 1.

Polarizer 20 and Substrate 21

The focused laser beam 3 first passes a first polarizer 20 and thereafter a substrate 21, which by an accurately specified refractive index finally focuses the laser beam 3 to about 0.8 mm.

PSD Layer 22

The finally-focused laser beam 3 thereafter reaches a transilluminable photolayer 22 consisting of a light-sensitive, two-dimensional lateral position detector, hereinafter referred to as PSD layer (positional sensitive device).

The PSD layer 22 serves to detect the position, in both the x-direction and the y-direction, of the point of incidence of the deflected laser beam 3 on the specific memory cell 11. In the embodiment of FIG. 1, each memory cell 11 has a separate PSD layer 22 of its own, as schematically illustrated in the plan view of FIG. 2C which illustrates how an optical memory having 4×4=16 memory cells 11 correspondingly includes sixteen separate PSD layers 22 having lateral dimensions of about 1×1 cm.

Storage Element 23

Further down in the storage medium 10 in FIG. 3, there is provided a bistable storage element 23, such as a ferro-electric liquid crystal (FLC), a PLZT ceramic material or a material using electro-optic effect based on electro-chromism. The storage element 23 serves to store information corresponding to a binary 1 or 0. The storage element 23 in FIG. 1 is assumed to be an FLC layer.

Electrode Matrix 24 and Insulation 25

Above and in contact with the storage element 23, there is provided an electrode matrix 24 comprising a grid of electrically mutually insulated, transilluminable electrode points, between which is provided an insulating matrix 25. There are no lead wires to the separate electrode points.

In the illustrated embodiment, the size of, and the distance between, the electrode points of the electrode matrix 24 is about 1 μm, each electrode point corresponding to one memory point of the memory cell 11. Each memory cell 11 therefore has 10 mm/2 μm=5000 memory points in each direction, i.e. a total of 5000×5000=25 million memory points.

Common Electrode 26

Below and in contact with the storage element 23, there is provided a second transilluminable electrode 26, which is common to all the 25 million memory points of the memory cell 11 and which is extended in the xy-plane over the entire memory cell 11.

Photoconductive Layer 27

Between said PSD layer 22 and said electrode matrix 24, there is provided, common to the entire memory cell 11, a transilluminable photoconductive layer 27 having light-intensity-dependent resistance.. The photoconductive layer 27 acts as a light-controlled switch, which serves to switch on and switch off an electric field between the electrode points of the electrode matrix 24 and the common electrode 26 if an electric control voltage is connected between the photoconductive layer 27 and the common electrode 26.

The function of the photoconductive layer 27 is as follows. A point P illuminated by the laser beam 3 on the photoconductive layer 27 will have low electric resistance relative to unilluminated areas of the layer 27. In such an illuminated memory point, a major part of the control voltage applied between the layers 27 and 26 will therefore be located between the electrode layers 24 and 26, i.e. over the storage element 23 but, as should be especially noted, only in the illuminated point. In unilluminated memory points in the same memory cell 11, a major part of the control voltage applied will be located over the photoconductive layer 27, since this has relatively high resistance in unilluminated memory points, and so a minor part of the voltage will be located over the storage element 24.

Memory Storage Function

In the structure described above, it is thus possible by deflecting the laser beam 3 to address a specific memory point P in the memory cell 11 among the 25 million memory points thereof, and create, with the aid of the photoconductive layer 27, an electric field over that part of the storage element 23 which is located below the illuminated point P, i.e. to store a binary 1 or 0 in this memory point. Physically, the FLC molecules and the light vector are rotated 90° in relation to said polarizer 20.

Since the storage element 23 is bistable, binary information previously stored is held unchanged in unilluminated memory points.

Polarizer (analyzer) 28

For read-out of binary information stored in this manner in a memory point P of the memory cell 11 in FIG. 3, there is provided below the common electrode 26 a second polarizer (analyzer) 28, whose angle of polarization is rotated 90° relative to the first polarizer 20 and which serves to let through or block a laser beam 3 which has passed through the bistable FLC storage element 23.

Light-sensitive layer 29

Below the polarizer 28, there is an amorphous light-sensitive layer 29 which serves to detect the status of the memory point concerned, in connection with read-out of stored information. Below the layer 29, there is finally a substrate 30.

The above function of the photosensitive layer 29 for read-out of stored information may also be used in connection with writing into the memory for checking that the information to be written in is actually stored.

Single Level—Function

One example of how it is possible in practice to perform writing into and read-out from the optical memory in FIGS. 1 and 3 will now be described in more detail with reference to FIG. 4.

FIG. 4 shows in perspective a broken-away part of a memory cell 11 according to FIG. 3, comprising however only two memory points, and in a block diagram the peripheral electronics connected thereto. The means for generating, collimating, deflecting and focusing the laser beam 3 are not shown in FIG. 4.

Incoming binary data information 40 and read-write control signals 41 and 42 are inputted and stored in a data buffer 43. These signals are forwarded to a unit 44 which is a combined shift register/switch device serving to shift out the parallel data information to a series of pulses which are level-adapted to a voltage level required for excitation of the FLC storage element 23. A generator 45 generates a signal +V for writing a logic 1, and a generator 46 generates a signal −V for writing a logic 0.

Each time the laser beam 3 is displaced by the deflecting means from one memory point to another, the current xy-position is computed in a unit 47 which receives positional signals 48 from the PSD layer 22. The current position of the laser beam 3 is computed as follows:

$$X=(x1-x2)/(x1+x2)$$

$$Y=(y1-y2)/(y1+y2)$$

wherein x1, x2, y1, y2 represent the voltage signals 48 from the PSD layer 22. A differential signal 49 from the unit 47, which can thus detect whether the beam 3 is correctly directed to a memory point, is emitted to the unit 44 to block or let through a write pulse 50 from a D-output of the unit 44. The write pulse 50, representing +V or −V for writing a logic 1 and a logic 0, respectively, is applied to the photoconductive layer 27 while the common electrode 26 is grounded at 51.

Read-out of data from a memory point in the memory cell in FIG. 4 is performed by deflecting the laser beam 3 towards the memory point. The light-sensitive layer 29 on the light exit side of the storage medium 10 will thus generate a signal 52 which is detected by a comparator 53 and the size of which indicates whether the optical state of the memory point is a logic 1 or 0. Data read from the memory is received at the output 54 of the comparator 53.

Multilevel Design

A second embodiment of an optical memory according to the invention will now be described with reference to FIGS. 5–7.

FIG. 5 is a cross-sectional view similar to FIG. 3 and illustrates a memory cell 11 in a storage medium 10 included in an optical memory according to the invention. The memory cell in FIG. 5 has, in the same way as the memory cell in FIG. 3, a large number of memory points which are distributed in a matrix pattern and which can be individually addressed by means of a light beam 3. Components corresponding to parts 1–9 in FIG. 1 may advantageously be used also in the embodiment of FIG. 5.

The storage medium in FIG. 5 comprises, similarly as the storage medium in FIG. 3, a polarizer 20, a final-focusing substrate 21, a PSD layer 22, an analysing polarizer 28 and a light-sensitive photolayer 29 whose function is the same as in the embodiment of FIG. 3 and therefore will not be described in more detail here.

The storage medium of FIG. 5 however has four storage levels N0–N3, as opposed to the storage medium in FIG. 3 which has only one such storage level. The lowermost level N0 comprises (from top to bottom) a photoconductive layer 27-0, and electrode matrix 24-0 with mutually insulated electrode points, a storage element 23-0 having at least two stable optical states, and a common electrode 26-0. Similarly, the other three levels N1–N3 each comprise a photoconductive layer 27-1, 27-2 and 27-3, respectively; an electrode matrix 24-1, 24-2 and 24-3, respectively; a storage element 23-1, 23-2 and 23-3, respectively; and a common electrode 26-1, 26-2 and 26-3, respectively. Substrates 30 are arranged between the levels and below the level N0.

The levels are substantially identical, except that they have differently thick storage elements 23. In FIG. 5, the level N0 has the thickest storage element 23-0, while the level N3 has the thinnest storage element 23-3.

By judiciously selecting the thicknesses, the four levels can present a 16-degree grey scale. In other words, a 4-bit word can be stored in each memory point. In the illuminated memory point in FIG. 5, there are, for example, stored (counting from below) the optical states dark-light-dark-light, representing e.g. the binary information 1010.

It obviously is of importance that the thickness of the four storage elements 23-0–23-3 is selected in such a manner that each light intensity sensed on the photolayer 29 in one memory point corresponds to one, and only one, out of the sixteen possible combinations of the states of the four storage levels in one memory point. FIG. 7 shows an example of how this can be achieved. The thickness of the storage elements 23 in levels N0–N3 is in this case selected in the following way. A dark state only in level N0 and a light state in each of levels N1–N3 give a relative transmittance reduction of 50%, as shown in the dashed box to the left in FIG. 7. Similarly, a dark state only in N1 gives a transmittance reduction of 25%, while N2 and N3 give a 15% and a 5% reduction, respectively. FIG. 7 shows in the box to the right all the sixteen possible combinations of light and dark states of the four levels N0–N1, and hence it appears that by detecting the intensity of transmitted light it is possible to unambiguously decide which combination the illuminated memory point has, i.e. which 4-bit word is stored.

The advantage of several storage levels is both an increased memory capacity per area and an increased read-write speed, since more bits are written and read simultaneously in one memory point.

In FIG. 5, 4 bits are stored in one memory point, but it is realized that this number can be increased to 8 or more according to the same principles, corresponding to e.g. a 256-degree grey scale.

Multilevel—Function

One example of the writing into and the read-out from an optical memory having a storage medium with several storage levels according to FIG. 5 will now be described in more detail with reference to FIG. 6.

FIG. 6 shows in perspective a broken-away part of a memory cell 11 according to FIG. 5, comprising however only two memory points, and in a block diagram peripheral electronics connected thereto. The means for generating, collimating, deflecting and focusing the laser beam 3 are not shown in FIG. 6.

Like parts in FIGS. 4 and 6 bear like reference numerals and function in substantially the same way.

Eight binary data bits D0–D7 (signals 40) are stored in a data buffer 43 together with read-write control signals 41 and 42, respectively. D0–D7 are divided into two 4-bit words which are stored in a buffer 55. In the buffer 55, the read-write control signals 41 and 42 are derived and forwarded to a converter 56.

Data bits D0–D3 from the buffer 55 are also supplied to the converter 56, which serves to adapt these four data bits to four voltages which are to represent a 16-degree analog grey scale. Output signals D0–D3 from the converter 56 thus correspond to the digital value of grey scale information stored in analog form.

The converter 56 operates as a level switch for converting information to write pulses (+V for a logic 1 and −V for a logic 0) with the aid of generators 45 and 46.

The write control signal 42 permits the presence of write pulses D0–D3 on the outputs of the level switch 56. The read control signals 41 block the outputs of the level switch 56 for D0–D3 when read-out takes place from the memory.

Writing into the storage medium 10 in FIG. 6 is performed in the following way. Assuming that the information to be stored from the buffer 55 has the following value and is to be written into the right-hand one of the two memory cells in FIG. 6, then:

D0=1, D1=0, D2=1, D3=0

For this information, the outputs D0–D3 of the level converter 56 will assume the following voltage values:

D0=+V, D1=−V, D2=+V, D3=−V

The voltage D0=+V is applied between the photoconductive layer 27-0 and the common electrode 26-0 of the lowermost level N0. In the illuminated memory cell, the storage element 23-0 (see FIG. 5) of the storage level N0 will therefore be excited to a dark state corresponding to a logic 1.

The voltage D1=−V is applied between the photoconductive layer 27-1 and the common electrode 26-1 of the lowermost but one level N1. If the storage element 23-1 of the storage level N1 was previously excited to a logic 1 (dark state), it will now be excited to a light state corresponding to a written-in binary logic 0. If the storage element 23-1 was previously excited to a logic 0 (light state), D1=−V is without effect and the storage element 23-1 remains in the light state, i.e. a logic 0.

The same applies to voltages D2 and D3 for the two uppermost storage levels N2 and N3, respectively.

The binary information D0–D3 (1010) from the buffer 55 is thus stored in the following optical states in the right-hand memory cell in FIG. 6, counting from below:

dark - light - dark - light

Read-out of such stored information from the storage medium in FIG. 6 is done by deflecting the laser beam 3 towards the memory point concerned. The light-sensitive layer 29 on the light exit side of the storage medium 10 will thus generate a signal 52, which represents the resulting transmittance from the four storage levels N0–N3 of the memory point. The analog detecting signal 52 is converted in an analog-to-digital converter 57 operating according to the principle illustrated in FIG. 7, to 4-bit digital binary information on the outputs D0–3, which then emit the logic signals 1010, i.e. the same information as has previously been read from the outputs D0–D3 of the buffer 55.

A third embodiment of an optical memory according to the invention will now be briefly described with reference to FIG. 8. The difference between the embodiment of FIG. 8 and the embodiment of FIG. 1 is that that deflecting system 6, 7 has been removed and replaced with means for displacing the light source itself. Thus, in FIG. 8, electrically controlled means 60 are connected to the upper side of the laser diode field 1 to displace this in the x- and y-directions. The means 60 may preferably comprise an xy-piezoelectric motor device of a type known to a person skilled in the art.

Another difference in FIG. 8, as compared with the embodiment of FIG. 1, is that the storage medium 10 for all the memory cells 11 is at a distance from both the laser diode field 1 and the light-sensitive layer 29. This embodiment makes it possible to arrange the memory cells on a common, replaceable disc or diskette 61 which in use is disposed stationary in the beam paths.

Finally, it should be noted that in FIG. 8 the light-sensitive layer or element 29 actually consists of a plurality of mutually insulated layers, one for each beam or memory cell, to enable parallel read-out from several memory cells.

A fourth embodiment of an optical memory according to the invention will now be described with reference to FIGS. 9, 9A and 9B. The components included in this embodiment have the same reference numerals as above for identical functions.

FIG. 9 shows a circular disc 62 which is rotatable about an axis of rotation 63 by means of an accurately controlled motor device (not shown). A laser diode field 1 is arranged on one side of the disc 62 (light entry side) and comprises a radially extended matrix or a row of individual semiconductor lasers. A piezoelectric motor means 64 enables radial displacement of the laser diode field 1. On the opposite side (light exit side) of the disc 62 opposite to the laser diode field 1, there is provided a photodetector matrix 29 comprising a separate light-sensitive layer for each light beam 3 from the laser diode field 1.

In this embodiment, the memory cells 11 are designed as concentric rings on the disc 62. The number of rings or memory cells corresponds to the number of light beams 3. Each light beam 3 need therefore only be displaceable radially a distance corresponding to the width of the ring. This is in contradistinction to e.g. a conventional CD player where the read optics must be moved over the entire disc. An extremely quick access is thus obtained also in this embodiment of the invention. The memory points of each memory cell are distributed both radially and circumferentially with respect to the axis of rotation 63.

FIG. 9A shows broken-away cross-sections of three radially distributed memory points of a memory cell. From this Figure appears that the storage medium 10 is of the same design as earlier and comprises a substrate 21, a storage element 23, an electrode matrix 24, a common electrode 26, a photoconductive layer 27 and a substrate 30. Further, there are provided two polarizers 20 and 28 which have the same function as in the previous embodiments and which optionally are stationary or accompany the disc 62. The two part views of FIG. 9A illustrate two different storage states of the three memory points illustrated. The dimensions and the spacings of the memory points are basically optional, but may, for example, be in agreement with FIG. 1.

FIG. 9 further shows an external, stationary light source 65 emitting a light beam 66 towards the center of the disc 62. The light beam 66 first passes an electronic polarizer 67 and then a collimator 68, 69 and thereafter is incident as polarized light 66' on a central photocell area 70 on the disc.

The light 66' which reaches the disc 62 is thus polarized by the polarizer 67. The photocell area 70 is intended, in response to the light received, to generate the control voltage between the photoconductive layer 27 and the common electrode 26 of the memory cells. To this end, the photocell area 70 (see FIG. 9B) comprises a first photocell 70a which generates a voltage when receiving light polarized in a first direction (left-hand part view in FIG. 9B) and a second photocell 70b which generates a voltage when receiving light polarized in an orthogonal second direction (right-hand part view in FIG. 9B). As shown in FIG. 9B, the output terminals are connected in parallel with opposite polarity, such that the control voltage to the memory cells becomes positive or negative depending on the direction of polarization of the incident light. The positive and the negative control voltage, respectively, correspond to the generators 45 and 46 in FIG. 4. To make the two control voltages available, a suitable switching frequency can be used for controlling the electric polarizer 67.

If required, the photocell area 70 may actually consist of a plurality of series-connected photocells 70a and 70b for achieving the required voltage level.

Performance

The storage capacity of an optical memory according to the invention can be very high. Table I shows the storage capacity and the read-write speed for different embodiments of an optical memory according to the invention, designed as a replaceable diskette according to FIG. 8. The active storage area is assumed to be 60 mm×60 mm, and the piezoelectric motor device 60 is assumed to operate at a speed of 15 cm/s.

In Table I, the upper part shows values without data compression, while the lower part shows corresponding values with a 10:1 data compression. In the Table, different cases are indicated both in respect of the size of the memory points and their mutual spacing, and in respect of the number of layers.

For a rotary medium according to FIG. 9, it may be assumed, by way of example, that the PZT motor 64 operates at a speed of 15 cm/s, and that each memory point can be reached in 7 μs, which with a data compression of 5:1 and 40 light sources enables reading or writing 200 bits and 25 bytes per 7 μs.

In an embodiment according to FIG. 1 using deflection, one may have, by way of example, a deflecting time of 1 μs per memory point, the corresponding values of storage capacity and read-write speed being readily computed.

We claim:

1. An optical memory, comprising:
a plurality of juxtaposed memory cells, each of which is adapted to receive a respective light beam and each of which includes a storage medium including:
  (a) a storage element switchable between at least two stable states having mutually different optical properties by applying corresponding electric fields between a light entry side and an opposite light exit side of the storage element;
  (b) an electrode matrix arranged on one of the light entry side and the light exit side of the storage element and exhibiting a plurality of mutually electrically insulated electrode points distributed over the storage element, corresponding to an equal plurality of memory points in the storage medium;
  (c) a common electrode arranged on and extended over an opposite side of the storage element from the electrode matrix; and
  (d) a photoconductive layer acting as a light-controlled switch and having light-dependent electric resistance, said layer being arranged over and in electrical contact with the electrode matrix on the side thereof facing away from the storage element, whereby an electric field 15 selectively applied over a given memory point in the storage element by selectively illuminating the corresponding point on the photoconductive layer while applying an electric control voltage between the photoconductive layer and the common electrode, and
electrically controlled means for simultaneously displacing the point of incidence of each of the light beams of the memory cells on the corresponding memory cell with a mutually equally large displacement.

2. An optical memory as claimed in claim 1, wherein the electrically controlled means include light-beam-deflecting acousto- or electro-optical crystal layers which are located on the light entry side of the memory cells and are common to several or all of the memory cells of the optical memory.

3. An optical memory as claimed in claim 2, wherein the memory cells are arranged beside each other in rows and columns, and
the light-beam-deflecting crystal layers include a first and a second crystal layer for deflecting the light beams parallel to said rows and columns, respectively.

4. An optical memory as claimed in claim 1, wherein the memory includes a light-source matrix of individual light sources for generating a separate light beam for each memory cell, and
the electrically controlled means are connected to the light-source matrix to bring about a displacement thereof, thereby bringing about a simultaneous and mutually equally large displacement of all the individual light sources.

5. An optical memory as claimed in claim 4, wherein the electrically controlled means includes a piezoelectric motor device.

6. An optical memory as claimed in claim 1, wherein the memory cells are arranged as concentric rings on a common disc, the opposite two main surfaces of which form, respectively, the light entry side and the light exit side of the memory cells, said disc being rotatable about a center axis, and the memory points of each memory cell being distributed both radially and circumferentially with respect to said axis.

7. An optical memory as claimed in claim 6, wherein the memory includes a light-source matrix including a row of individual light sources, radially extended with respect to the axis of rotation of the disc, for generating a separate light beam for each memory cell, and the electrically controlled means are connected to the light-source matrix to bring about a radial displacement of the light sources with respect to the axis of rotation of the disc, whereby rotation of the disc and radial displacement of the light-source matrix, concurrently or separately, enables said displacement of the points of incidence of the light beams on the memory cells.

8. An optical memory as claimed in claim 6, wherein the electrically controlled means include a radially acting piezoelectric motor device.

9. An optical memory as claimed in claim 6, wherein the rotatable disc is provided with a photocell means for receiving light from a preferably stationary light source and generating, in response thereto, the control voltage between the photoconductive layer and the common electrode of the memory cells.

10. An optical memory as claimed in claim 9, wherein the photocell means arranged on the disc includes a first photocell which generates a voltage when receiving light polarized in a first direction, and a second photocell which generates a voltage when receiving light polarized in a second direction perpendicular to the first direction of polarization, and the output terminals of the first and the second photocell are connected with opposite polarity in parallel with the memory cells for generating a positive or a negative control voltage depending on the direction of polarization of the light received from the stationary light source.

11. An optical memory as claimed in claim 1, wherein the storage medium of each of the memory cells further includes a respective light-sensitive element arranged on the light exit side of the storage element for receiving and detecting a light beam to be directed through the storage medium for read-out of stored information, said light-sensitive elements of the memory cells being insulated from each other so as to permit a simultaneous parallel read-out of information stored in the memory points of several memory cells.

12. An optical memory as claimed in claim 1, wherein each memory cell includes a plurality of storage mediums, such that each memory cell has a number, greater than two, of storage levels arranged on each other, each storage level being provided with one of the storage mediums, thereby providing each memory point with a number of memory positions equal to the number of storage levels.

13. An optical memory as claimed in claim 1, wherein the storage medium has the form of a laminate structure.

14. An optical memory as claimed in claim 1, wherein the electrode matrix is arranged on the light entry side of the storage element, and the common electrode is arranged on the light exit side of the storage element.

15. An optical memory as claimed in claim 1, wherein said different optical states of the storage element correspond to different states of light transmittance of the storage medium 16. An optical memory as claimed in claim 15, wherein the storage element has different light-rotating properties in said different optical states, and that the storage medium further includes two polarizers set at a 90° angle to each other and arranged at the light entry side and the light exit side, respectively, of the storage element for analyzing the optical state in the memory points of the storage element.

17. An optical memory as claimed in claim 1, wherein the storage element includes a ferroelectric liquid crystal.

18. An optical memory as claimed in claim 1, wherein the storage element comprises a PLZT ceramic or a thin film.

\* \* \* \* \*